(12) United States Patent
Friedlander

(10) Patent No.: US 8,886,541 B2
(45) Date of Patent: Nov. 11, 2014

(54) REMOTE CONTROLLER WITH POSITION ACTUATATED VOICE TRANSMISSION

(75) Inventor: Steven Friedlander, San Diego, CA (US)

(73) Assignee: Sony Corporation, Tokyo (JP)

( * ) Notice: Subject to any disclaimer, the term of this patent is extended or adjusted under 35 U.S.C. 154(b) by 905 days.

(21) Appl. No.: 12/658,230

(22) Filed: Feb. 4, 2010

(65) Prior Publication Data

US 2011/0191108 A1     Aug. 4, 2011

(51) Int. Cl.
| | |
|---|---|
| *G10L 21/00* | (2013.01) |
| *H04L 17/02* | (2006.01) |
| *H03K 17/94* | (2006.01) |
| *G09G 5/00* | (2006.01) |

(52) U.S. Cl.
CPC .............. *G09G 5/00* (2013.01); *G08C 2201/91* (2013.01); *G08C 2201/31* (2013.01); *G08C 2201/32* (2013.01); *H04L 17/02* (2013.01); *H03K 17/94* (2013.01)
USPC ........................................................ 704/270

(58) Field of Classification Search
CPC ..... G06F 3/0346; G06F 3/167; G06F 3/0304; G06F 3/0338; G06F 3/042; G06F 3/1423; G10L 2015/223; H04N 21/4126
USPC ................................. 704/270, 276
See application file for complete search history.

(56) References Cited

U.S. PATENT DOCUMENTS

| | | | | |
|---|---|---|---|---|
| 5,684,882 | A * | 11/1997 | Mahieux et al. | 381/92 |
| 5,848,170 | A * | 12/1998 | Mahieux et al. | 381/92 |
| 5,917,944 | A * | 6/1999 | Wakisaka et al. | 382/190 |
| 6,397,186 | B1 * | 5/2002 | Bush et al. | 704/274 |
| 6,956,564 | B1 * | 10/2005 | Williams | 345/179 |
| 7,039,590 | B2 | 5/2006 | Luchaup | |
| 7,260,538 | B2 | 8/2007 | Calderone et al. | |
| 7,321,857 | B2 | 1/2008 | Rodriguez et al. | |
| 8,044,791 | B2 * | 10/2011 | Bulitta et al. | 340/500 |
| 8,050,881 | B1 * | 11/2011 | Yeung et al. | 702/89 |
| 8,112,281 | B2 * | 2/2012 | Yeung et al. | 704/270 |

(Continued)

FOREIGN PATENT DOCUMENTS

| | | |
|---|---|---|
| CN | 1975799 | 6/2007 |
| CN | 10139446 | 3/2009 |

(Continued)

OTHER PUBLICATIONS

"Multimodal Voice Search for Interactive Media," AT&T, publication date unknown, brought to applicant's attention Dec. 7, 2009.

(Continued)

*Primary Examiner* — Michael N Opsasnick

(74) *Attorney, Agent, or Firm* — Miller Patent Services; Jerry A. Miller

(57) ABSTRACT

A method of operation of a remote controller consistent with certain implementations involves determining a spatial orientation of the remote controller based upon an output signal from a position detector; and setting a voice mode of operation of the remote controller as active or inactive based upon the spatial orientation of the remote controller as determined by the position detector, where the voice mode determines whether or not the remote controller will accept and process voice information from a microphone. This abstract is not to be considered limiting, since other embodiments may deviate from the features described in this abstract.

25 Claims, 4 Drawing Sheets

(56) References Cited

U.S. PATENT DOCUMENTS

| | | | |
|---|---|---|---|
| 2002/0032566 A1* | 3/2002 | Tzirkel-Hancock et al. | 704/241 |
| 2005/0049862 A1 | 3/2005 | Choi et al. | |
| 2005/0144009 A1* | 6/2005 | Rodriguez et al. | 704/275 |
| 2005/0197145 A1* | 9/2005 | Chae et al. | 455/517 |
| 2005/0200325 A1* | 9/2005 | Kim et al. | 318/568.12 |
| 2006/0028337 A1 | 2/2006 | Li | |
| 2006/0050168 A1* | 3/2006 | Okada et al. | 348/333.06 |
| 2006/0210111 A1* | 9/2006 | Cleveland et al. | 382/103 |
| 2006/0271263 A1* | 11/2006 | Self et al. | 701/50 |
| 2006/0281989 A1* | 12/2006 | Viswanathan et al. | 600/424 |
| 2007/0061148 A1* | 3/2007 | Cross et al. | 704/275 |
| 2009/0076827 A1* | 3/2009 | Bulitta et al. | 704/275 |
| 2009/0204409 A1 | 8/2009 | Mozer et al. | |
| 2011/0074693 A1* | 3/2011 | Ranford et al. | 345/173 |

FOREIGN PATENT DOCUMENTS

| | | |
|---|---|---|
| EP | 1 079 352 A1 | 2/2001 |
| KR | 2002-0021829 | 3/2002 |
| WO | WO 95/06309 | 3/1995 |

OTHER PUBLICATIONS

"AT&T Offers a Sneak Peek at Concepts for New Applications," Todd Spangler, Multichannel news, Sep. 21, 2008.

Yes, This is How I Want to Search TV Shows, MG Siegler, TechCrunch, Nov. 5, 2009.

"My Voice Remote Gives Your Fingers a Break," Cyrus Farivar, Engadget website, Nov. 17, 2006.

"ADXL330," Analog Devices, 2007.

* cited by examiner

REMOTE CONTROLLER WITH POSITION ACTUATATED VOICE TRANSMISSION

COPYRIGHT AND TRADEMARK NOTICE

A portion of the disclosure of this patent document contains material which is subject to copyright protection. The copyright owner has no objection to the facsimile reproduction of the patent document or the patent disclosure, as it appears in the Patent and Trademark Office patent file or records, but otherwise reserves all copyright rights whatsoever. Trademarks are the property of their respective owners.

BACKGROUND

As television systems become more complex, the limitations of current remote controllers becomes an increasing source of frustration. Typing search strings on an onscreen keyboard using a conventional remote controller is difficult and frustrating.

BRIEF DESCRIPTION OF THE DRAWINGS

Certain illustrative embodiments illustrating organization and method of operation, together with objects and advantages may be best understood by reference detailed description that follows taken in conjunction with the accompanying drawings in which.

DETAILED DESCRIPTION

Figure 1:
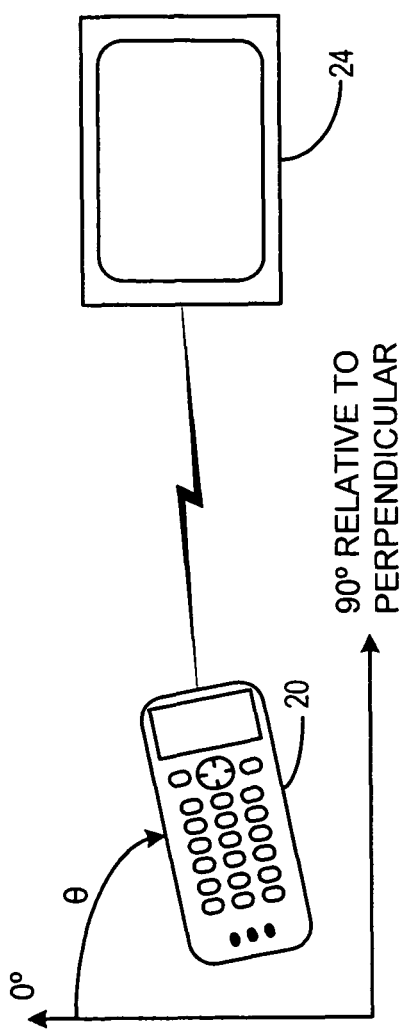
FIG. 1 is an illustration depicting a coordinate system and remote controller orientation consistent with certain embodiments of the present invention.

While this invention is susceptible of embodiment in many different forms, there is shown in the drawings and will herein be described in detail specific embodiments, with the understanding that the present disclosure of such embodiments is to be considered as an example of the principles and not intended to limit the invention to the specific embodiments shown and described. In the description below, like reference numerals are used to describe the same, similar or corresponding parts in the several views of the drawings.

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically. The term "program" or "computer program", or "application" or similar terms, as used herein, is defined as a sequence of instructions designed for execution on a computer system. A "program", or "computer program", may include a subroutine, a function, a procedure, an object method, an object implementation, in an executable application, an applet, a servlet, a source code, an object code, a shared library/dynamic load library and/or other sequence of instructions designed for execution on a computer system. The term "processor", "controller", "CPU", "Computer" and the like as used herein encompasses both hard programmed, special purpose, general purpose and programmable devices and may encompass a plurality of such devices or a single device in either a distributed or centralized configuration without limitation.

Reference throughout this document to "one embodiment", "certain embodiments", "an embodiment", "an example", "an implementation" or similar terms means that a particular feature, structure, or characteristic described in connection with the embodiment, example or implementation is included in at least one embodiment, example or implementation of the present invention. Thus, the appearances of such phrases or in various places throughout this specification are not necessarily all referring to the same embodiment, example or implementation. Furthermore, the particular features, structures, or characteristics may be combined in any suitable manner in one or more embodiments, examples or implementations without limitation.

The term "or" as used herein is to be interpreted as an inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

As previously noted, as television systems become more complex, the limitations of current remote controllers becomes an increasing source of frustration. Typing search strings on an onscreen keyboard using a conventional remote controller is difficult and frustrating. A mechanism for entry of voice commands or using voice to carry out a voice search would be much easier. In such case it is desirable to screen out the surrounding noise from the TV and the living room environment and concentrate on the person's voice.

In accord with certain implementations, a TV can do voice searches using a microphone built into the remote controller. The search could be activated by tilting the remote into an upright position like a hand held microphone. When the remote controller is oriented more toward the horizontal (toward the TV or resting on a table, for example) the remote controller disables the microphone. The microphone could be highly directional to try to capture the persons voice over the TV's volume and this directionality can be capitalized upon by having the remote actuated only when oriented approximately vertically (within some specified angle). Since a user would generally face the television while using voice commands, the microphone's directionality is taken advantage of by the microphone generally pointing away from the television (or related system component) being controlled.

As noted, the remote controller could have a highly directional microphone built into it. Then it could be triggered to turn on and bring up the search window on the TV's OSD when the remote is tilted into and upright position. That is also a natural position to hold something that is "microphone-like". The voice search capability would be a helpful time saver for a TV watcher, but you need to get good results to make it useful. Room noise and TV volume is preferably screened out to get good results. The combination of a highly directional microphone and the turning on with the position of the remote controller provides a good user experience while providing natural shielding for the microphone. This same voice search could be used in anything with an OSD and a remote controller including, but not limited to dvd players, blu-ray players, cable boxes, game systems, etc.

Turning now to FIG. 1, a television remote controller 20 is shown in a conventional orientation of approximately horizontal such that the keypad is visible and readily actuated by the user in order to control functions in this simple example system including only a TV 24. It will be understood that the present remote controller is not limited to control of a television set, but that this is being used as a convenient example. This illustration also depicts a vertical and a horizontal axis. In the coordinate system used herein, 0 degrees is considered vertical, with 90 degrees in any direction being considered horizontal. In the depiction shown, the remote controller 20 is resting at an angle θ that is approximating horizontal (but not quite in this illustration).

Figure 2:
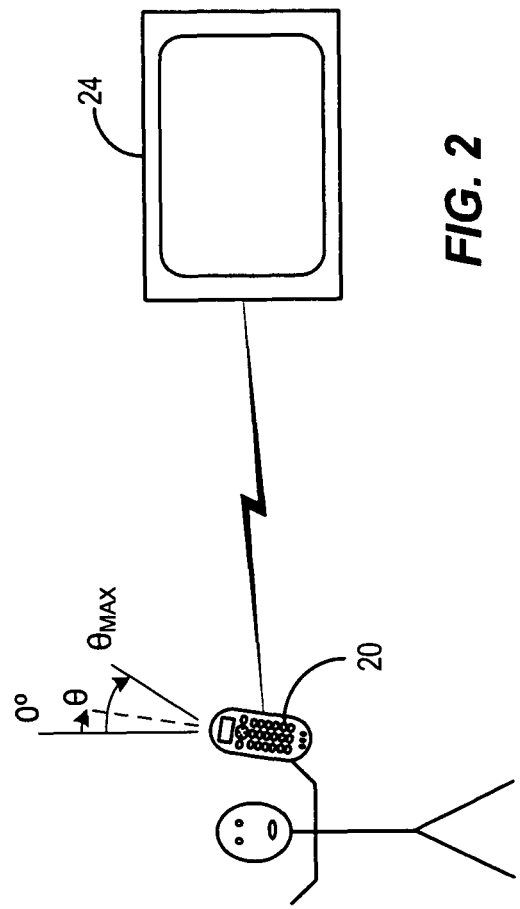
FIG. 2 is an illustration depicting near vertical positioning in a manner consistent with certain embodiments of the present invention.

Referring to FIG. 2, remote controller 20 is depicted as being held by a person (shown as a stick figure for convenience of illustration) in a position where the angle θ is closer to horizontal in a position that a user would consider natural for speaking into an electronic device. In so positioning the, remote controller, the user activates the voice command circuitry which may involve any number of actions within the remote controller including turning on a microphone, turning on a voice recognition system, turning on a transmitter or other action the effectively makes the voice function operational for the user. By way of illustrative embodiment and not by way of limitation, when the user tilts the remote controller to the near vertical position, the remote controller is placed into a voice mode in which signals from the microphone are converted to digital signals. Those digital signals can represent commands or search strings. The commands and search strings can then be sent to the television 24 for execution. In other embodiments, orientation of the remote controller to the vertical position can simply open a transmission channel to the television so that processing of transmitted speech or other sounds can be carried out at the television set. Noise cancellation technology can also be used to minimize the effect of background noise including those coming from the television system. In other embodiments, the television can be muted as a result of the orientation of the remote controller into the vertical position.

In order to make a determination as to the spatial position of the remote controller, for purposes of the present implementations, the remote controller need only determine whether it is oriented close enough to vertical to be considered horizontal for purposes of activating the appropriate circuitry. Thus, consistent with the coordinate system discussed above, the remote controller 20 is considered vertical if it is oriented top to bottom within a specified number of degrees $\theta_{MAX}$ if of 0° vertical. While two dimensions are depicted, it is understood that the angle $\theta_{MAX}$ defines a cone in three dimensions within which the remote controller 20 is considered vertical. The value of $\theta_{MAX}$ can be determined experimentally or can be user modified. Generally, one wishes to minimize falsely turning on the feature in order to conserve battery life and minimize false activation, so one value could be 30° from vertical, but others may prefer anywhere from 15° to 45°, more or less. In any event, the terms "approximately vertical" or "vertical" as used herein are intended to mean within $\theta_{MAX}$ degrees of 0 degrees vertical. It is also noted that for ease of illustration, a single value of $\theta_{MAX}$ is used, but one could apply hysteresis such that the angular value required to enter the voice mode is different from the angular value required to exit the voice mode.

Figure 3:
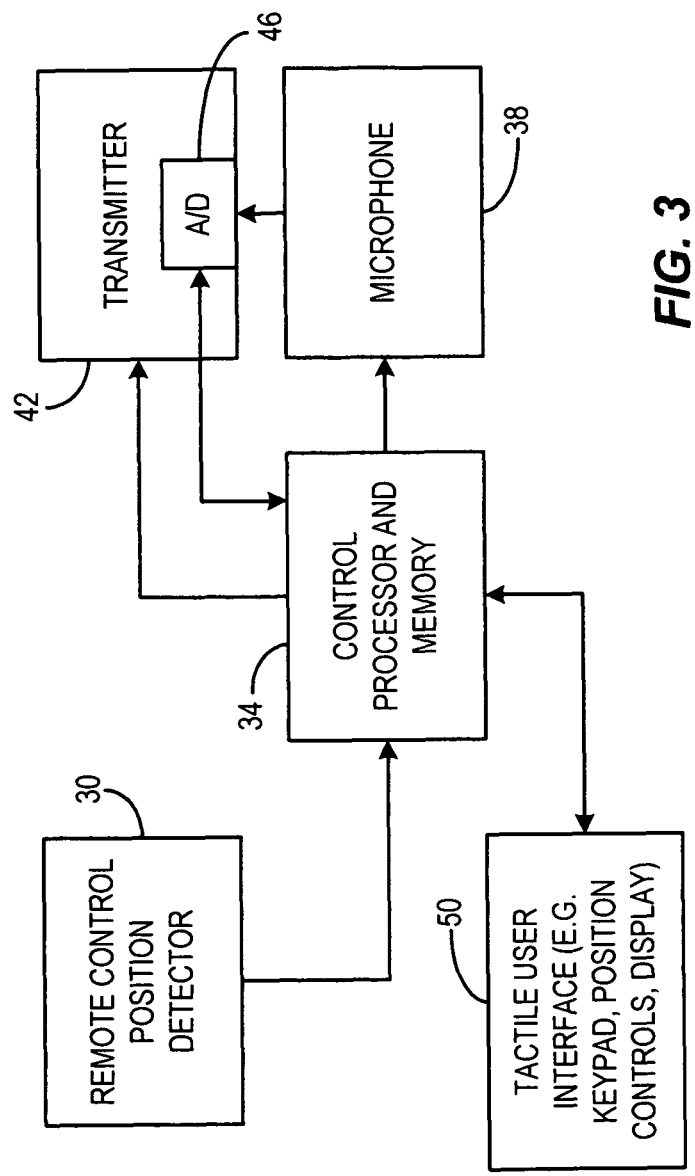
FIG. 3 is an example block diagram of an illustrative remote controller consistent with certain embodiments of the present invention.

FIG. 3 depicts an example remote controller system in which the remote controller incorporates a position detector circuit 30. Such circuits can be fabricated around commercially available devices such as miniature accelerometers or even gravity actuated switches. The output of the remote controller position detector 30 is provided to a hardware or software based control processor (and possibly associated memory) for determining if the threshold value of $\theta_{MAX}$ has been crossed. This information determines the operation of microphone and transmitter 38 and 42 respectively. The transmitter may be, for example, an infrared transmitter or Bluetooth or other RF transmitter without limitation. In certain implementations, the output of the microphone may be processed to convert the microphone signal from analog to digital as depicted by A/D converter 46. In this manner the processor 34 can determine whether a command is to be executed or a search stream is to be processed for transmission to the target device such as a TV. Hence, the processor 34 acts as a switch or a control for a switch that actuates the transmitter and or microphone. In certain implementations, the remote controller operates in a conventional manner using a tactile user interface 50 also.

Figure 4:
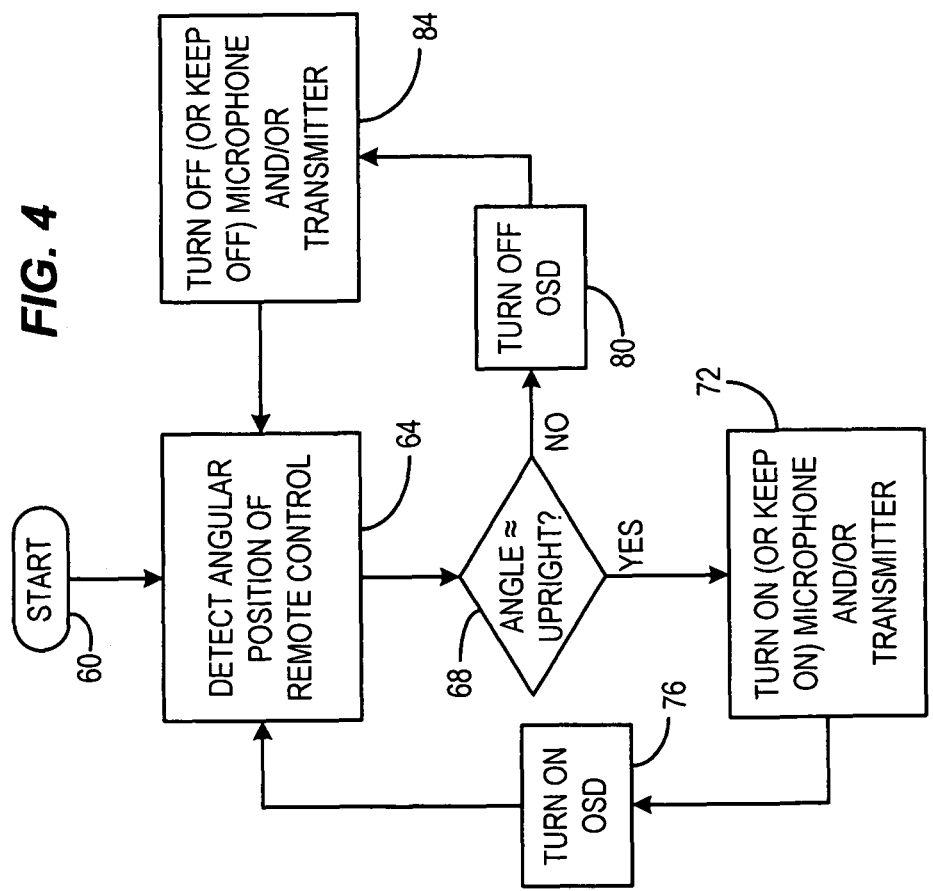
FIG. 4 is an example of a flow chart of an illustrative process consistent with certain embodiments of the present invention.

One example process for operation of the television or other target device utilizing the remote controller 20 is depicted in FIG. 4. In this example, the process starts at 60 after which the angular position is determined by the position detector of the remote controller 20 at 64. A determination is made at 68 using this angular position as to whether or not the remote controller 20 is in the near vertical position or not based on a comparison with the threshold value $\theta_{MAX}$. If the remote controller is deemed to be near vertical (upright) at 68, the microphone and/or associated transmitter circuit is turned on or kept on at 72. In certain implementations, a signal can be sent to the target device (TV) to turn on the on-screen display (OSD) at 76 as a result of the angular position being considered near vertical. At this point, the user can enter voice entries such as commands or search strings verbally and control passes to 64 to continuously monitor the angular position of the remote controller 20.

If at 68, the angle is no longer considered upright (near vertical), in this example a signal is sent to turn off the OSD at 80 and then the microphone and or transmitter is turned off at 84 and control returns to 64 to continuously monitor the angular position of the remote controller 20.

In this example, the same value of $\theta_{MAX}$ is used as the point of triggering both on and off actions of the remote controller. But, if hysteresis is to be added $\theta_{MAX}$ at block 68 which is used as the threshold for determining on versus off can be made different depending on the on or off state of the voice mode. In such a case, two different values of $\theta_{MAX}$ are used, one when the voice mode is on, the other when the voice mode is off.

Figure 5:
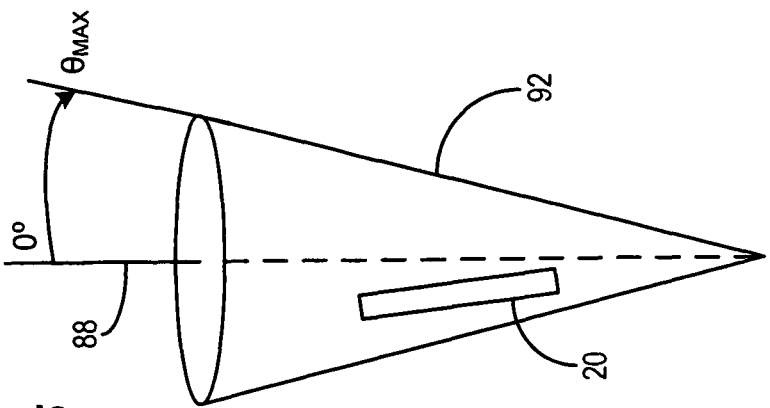
FIG. 5 is an illustration of a cone defining near vertical in a manner consistent with certain embodiments of the present invention.

With reference to FIG. 5, it is noted that the value of $\theta_{MAX}$ actually defines the boundaries of a cone with axis 88 and boundaries 92 within which any orientation of the remote controller 20 is considered to be near vertical. While it is preferred that the user orient the microphone away from the TV or other device being controlled, the near vertical position determines the state of the voice mode.

While a television remote controller has been used as an example implementation, other devices with an on screen display or which are a part of a television or home entertainment system can equally well benefit from embodiments consistent with the present invention.

Figure 6:
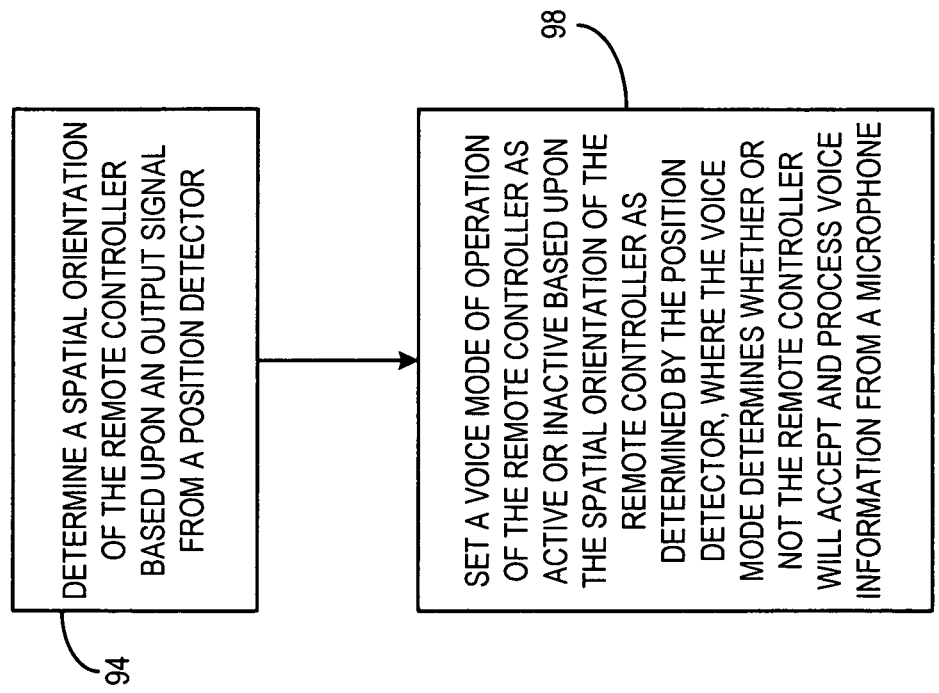
FIG. 6 is another example flow chart of operation of an example implementation consistent with certain embodiments of the present invention.

Referring to FIG. 6 another example process is depicted consistent with certain implementations of the present invention. In this method of operation of a remote controller the process operates by determining a spatial orientation of the remote controller based upon an output signal from a position detector 94; and sets a voice mode of operation of the remote controller 98 as active or inactive based upon the spatial orientation of the remote controller 98 as determined by the position detector 94, where the voice mode determines whether or not the remote controller 98 will accept and process voice information from a microphone.

Thus, a remote controller consistent with certain implementations has a position detector that detects a spatial orientation of the remote controller and a microphone for receipt of voice information. A transmitter transmits the voice information or a message derived therefrom. A controlled switch activates and deactivates at least one of the microphone and the transmitter based upon the spatial orientation of the remote controller as detected by the position detector to control a voice mode of operation of the remote controller.

In certain implementations, the remote controller further has a tactile user interface for manual entry of commands or data. In certain implementations, the microphone has unidirectional characteristics. In certain implementations, the transmitter transmits a command in response to a specified spatial orientation of the remote controller as detected by the position detector. In certain implementations, the command generates an on-screen display. In certain implementations, voice signals are converted to search strings that are entered into the on-screen display. In certain implementations, the voice mode is considered active if the remote controller is oriented top to bottom in a near vertical spatial orientation within a threshold value of $\theta_{MAX}$ of true vertical. In certain implementations, the value of $\theta_{MAX}$ depends upon whether the voice mode is active or inactive. In certain implementations, an analog to digital converter converts voice signals from the microphone to digital signals.

In another implementation, a remote controller has a position detector that detects a spatial orientation of the remote controller and a microphone for receipt of voice information. A tactile user interface is provided for manual entry of commands or data. A transmitter transmits the voice information or information derived therefrom and commands or data from the tactile user interface. A processor activates and deactivates at least one of the microphone and the transmitter based upon the spatial orientation of the remote controller as detected by the position detector to control a voice mode of operation of the remote controller.

In certain implementations, the microphone has unidirectional characteristics. In certain implementations, the transmitter transmits a command in response to a specified spatial orientation of the remote controller as detected by the position detector and wherein the command generates an on-screen display and wherein voice signals are converted to search strings that are entered into the on-screen display. In certain implementations, the voice mode is considered active if the remote controller is oriented top to bottom in a near vertical spatial orientation within a threshold value of $\theta_{MAX}$ of true vertical. In certain implementations, the value of $\theta_{MAX}$ depends upon whether the voice mode is active or inactive.

A method of operation of a remote controller involves determining a spatial orientation of the remote controller based upon an output signal from a position detector; and setting a voice mode of operation of the remote controller as active or inactive based upon the spatial orientation of the remote controller as determined by the position detector, where the voice mode determines whether or not the remote controller will accept and process voice information from a microphone.

In certain implementations, the microphone has unidirectional characteristics. In certain implementations, the process further transmits a command when the remote controller is placed in the active voice mode. In certain implementations, the command generates an on-screen display. In certain implementations, voice signals are converted to search strings that are entered into the on-screen display. In certain implementations, the voice mode is considered active if the remote controller is oriented top to bottom in a near vertical spatial orientation within a threshold value of $\theta_{MAX}$ of true vertical. In certain implementations, the value of $\theta_{MAX}$ depends upon whether the voice mode is active or inactive.

Another method of operation of a remote controller involves determining a spatial orientation of the remote controller based upon an output signal from a position detector; setting a voice mode of operation of the remote controller as active or inactive based upon the spatial orientation of the remote controller as determined by the position detector, where the voice mode determines whether or not the remote controller will accept and process voice information from a microphone having unidirectional characteristics; transmitting a command when the remote controller is placed in the active voice mode, wherein the command generates an on-screen display and wherein voice signals are converted to search strings that are entered into the on-screen display; and where the voice mode is considered active if the remote controller is oriented top to bottom in a near vertical spatial orientation within a threshold value of $\theta_{MAX}$ of true vertical. In certain implementations, the value of $\theta_{MAX}$ depends upon whether the voice mode is active or inactive.

A tangible computer readable electronic storage medium can store instructions which, when executed on one or more programmed processors, carry out any of the above methods.

Those skilled in the art will recognize, upon consideration of the above teachings, that certain of the above exemplary embodiments are based upon use of a programmed processor. However, the invention is not limited to such exemplary embodiments, since other embodiments could be implemented using hardware component equivalents such as special purpose hardware and/or dedicated processors. Similarly, general purpose computers, microprocessor based computers, micro-controllers, optical computers, analog computers, dedicated processors, application specific circuits and/or dedicated hard wired logic may be used to construct alternative equivalent embodiments.

Those skilled in the art will appreciate, upon consideration of the above teachings, that the program operations and processes and associated data used to implement certain of the embodiments described above can be implemented using disc storage as well as other forms of storage such as for example Read Only Memory (ROM) devices, Random Access Memory (RAM) devices, network memory devices, optical storage elements, magnetic storage elements, magneto-optical storage elements, flash memory, core memory and/or other equivalent volatile and non-volatile storage technologies without departing from certain embodiments of the present invention. Such alternative storage devices should be considered equivalents.

Certain embodiments described herein, are or may be implemented using a programmed processor executing programming instructions that are broadly described above in flow chart form that can be stored on any suitable electronic or computer readable storage medium. However, those skilled in the art will appreciate, upon consideration of the present teaching, that the processes described above can be implemented in any number of variations and in many suitable programming languages without departing from embodiments of the present invention. For example, the order of certain operations carried out can often be varied, additional operations can be added or operations can be deleted without departing from certain embodiments of the invention. Error trapping can be added and/or enhanced and variations can be made in user interface and information presentation without departing from certain embodiments of the present invention. Such variations are contemplated and considered equivalent.

While certain illustrative embodiments have been described, it is evident that many alternatives, modifications, permutations and variations will become apparent to those skilled in the art in light of the foregoing description.

What is claimed is:

1. A remote controller, comprising:
   a position detector, forming a part of the remote controller, that detects a spatial orientation of the remote controller relative to horizontal and vertical;
   a microphone, forming a part of the remote controller, for receipt of voice information;
   a transmitter, forming a part of the remote controller, configured to transmit the voice information or a message derived therefrom as a remote controller command; and
   a controlled switch, forming a part of the remote controller, configured to activate and deactivate at least one of the microphone and the transmitter based upon the spatial orientation of the remote controller relative to horizontal and vertical as detected by the position detector to thereby activate or deactivate a voice mode of operation of the remote controller, wherein the transmitter transmits a command in response to a specified spatial orientation with respect to horizontal and vertical of the remote controller as detected by the position detector.

2. The remote controller in accordance with claim 1, further comprising a tactile user interface for manual entry of commands or data.

3. The remote controller in accordance with claim 1, wherein the microphone has unidirectional characteristics.

4. The remote controller in accordance with claim 1, wherein the command generates an on-screen display.

5. The remote controller in accordance with claim 4, wherein voice signals are converted to search strings that are entered into the on-screen display.

6. The remote controller in accordance with claim 1, wherein the voice mode is considered active if the remote controller is oriented top to bottom in a near vertical spatial orientation within a threshold value of $\theta_{MAX}$ of true vertical.

7. The remote controller in accordance with claim 6, wherein the value of $\theta_{MAX}$ depends upon whether the voice mode is active or inactive.

8. The remote controller in accordance with claim 1, further comprising an analog to digital converter, forming a part of the remote controller, that converts voice signals from the microphone to digital signals.

9. A remote controller, comprising:
   a position detector, forming a part of the remote controller, that detects a spatial orientation of the remote controller relative to horizontal and vertical;
   a microphone, forming a part of the remote controller, for receipt of voice information;
   a tactile user interface, forming a part of the remote controller, for manual entry of commands or data;
   a transmitter, forming a part of the remote controller, that transmits the voice information or information derived therefrom and commands or data from the tactile user interface;
   a processor, forming a part of the remote controller, that activates and deactivates at least one of the microphone and the transmitter based upon the spatial orientation relative to horizontal and vertical of the remote controller as detected by the position detector to thereby activate or deactivate a voice mode of operation of the remote controller; and
   wherein the transmitter transmits a command in response to a specified spatial orientation of the remote controller as detected by the position detector and wherein the command generates an on-screen display and wherein voice signals are converted to search strings that are entered into the on-screen display.

10. The remote controller in accordance with claim 9, wherein the microphone has unidirectional characteristics.

11. The remote controller in accordance with claim 9, wherein the command generates an on-screen display and wherein voice signals are converted to search strings that are entered into the on-screen display.

12. The remote controller in accordance with claim 9, wherein the voice mode is considered active if the remote controller is oriented top to bottom in a near vertical spatial orientation within a threshold value of $\theta_{MAX}$ of true vertical.

13. The remote controller in accordance with claim 12, wherein the value of $\theta_{MAX}$ depends upon whether the voice mode is active or inactive.

14. A method of operation of a remote controller, comprising:
   determining a spatial orientation relative to horizontal and vertical of the remote controller based upon an output signal from a position detector forming a part of the remote controller;
   setting a voice mode of operation of the remote controller as active or inactive based upon the spatial orientation of the remote controller relative to horizontal and vertical as determined by the position detector, where the voice mode determines whether or not the remote controller will accept and process voice information from a microphone; and
   at a transmitter, transmitting a command in response to a specified spatial orientation with respect to horizontal and vertical of the remote controller as detected by the position detector.

15. The method in accordance with claim 14, wherein the microphone has unidirectional characteristics.

16. The method in accordance with claim 14, further comprising transmitting a command when the remote controller is placed in the active voice mode.

17. The method in accordance with claim 16, wherein the command generates an on-screen display.

18. The method in accordance with claim 17, wherein voice signals are converted to search strings that are entered into the on-screen display.

19. The method in accordance with claim 14, wherein the voice mode is considered active if the remote controller is oriented top to bottom in a near vertical spatial orientation within a threshold value of $\theta_{MAX}$ of true vertical.

20. The method in accordance with claim 19, wherein the value of $\theta_{MAX}$ depends upon whether the voice mode is active or inactive.

21. A tangible non-transitory computer readable electronic storage medium storing instructions which, when executed on one or more programmed processors, carry out a method comprising:
   at position detector forming a part of remote controller, detecting a spatial orientation of the remote controller relative to horizontal and vertical;
   at a microphone forming a part of the remote controller, receiving voice information;

at a transmitter forming a part of the remote controller, transmitting the voice information or a message derived therefrom as a remote controller command;

activating or deactivating at least one of the microphone and the transmitter based upon the spatial orientation of the remote controller relative to horizontal and vertical as detected by the position detector to thereby activate or deactivate a voice mode of operation of the remote controller; and the transmitter transmitting a command in response to a specified spatial orientation with respect to horizontal and vertical of the remote controller as detected by the position detector.

22. A method of operation of a remote controller, comprising:

determining a spatial orientation relative to horizontal and vertical of the remote controller based upon an output signal from a position detector forming a part of the remote controller;

setting a voice mode of operation of the remote controller as active or inactive based upon the spatial orientation relative to horizontal and vertical of the remote controller as determined by the position detector, where the voice mode determines whether or not the remote controller will accept and process voice information from a microphone having unidirectional characteristics;

transmitting a command from the remote controller when the remote controller is placed in the active voice mode, wherein the command generates an on-screen display and wherein voice signals are converted to search strings that are entered into the on-screen display; and where the voice mode is considered active if the remote controller is oriented top to bottom in a near vertical spatial orientation within a threshold value of $\theta_{MAX}$ of true vertical.

23. The method in accordance with claim 22, wherein the value of $\theta_{MAX}$ depends upon whether the voice mode is active or inactive.

24. A tangible non-transitory computer readable electronic storage medium storing instructions which, when executed on one or more programmed processors, carry out a method comprising:

determining a spatial orientation relative to horizontal and vertical of the remote controller based upon an output signal from a position detector forming a part of the remote controller;

setting a voice mode of operation of the remote controller as active or inactive based upon the spatial orientation relative to horizontal and vertical of the remote controller as determined by the position detector, where the voice mode determines whether or not the remote controller will accept and process voice information from a microphone having unidirectional characteristics;

transmitting a command from the remote controller when the remote controller is placed in the active voice mode, wherein the command generates an on-screen display and wherein voice signals are converted to search strings that are entered into the on-screen display; and where the voice mode is considered active if the remote controller is oriented top to bottom in a near vertical spatial orientation within a threshold value of $\theta_{MAX}$ of true vertical.

25. A remote controller, comprising:

a position detector, forming a part of the remote controller, configured to detect a spatial orientation of the remote controller relative to horizontal and vertical;

a microphone, forming a part of the remote controller, for receipt of voice information;

a remote controller keyboard, forming a part of the remote controller, that provides for entry of keyboard commands to a target device;

a transmitter, forming a part of the remote controller, configured to transmit the voice information or a message derived therefrom, where the voice information or message derived therefrom is limited to commands that can be issued by the keyboard commands; and a controlled switch, forming a part of the remote controller, that is configured to activate and deactivate at least one of the microphone and the transmitter based upon the spatial orientation of the remote controller relative to horizontal and vertical as detected by the position detector to thereby activate or deactivate a voice mode of operation of the remote controller, where the voice mode is considered active if the remote controller is oriented top to bottom in a near vertical spatial orientation within a threshold value of $\theta_{MAX}$ of true vertical.

* * * * *